(12) United States Patent
Morita et al.

(10) Patent No.: US 11,723,183 B2
(45) Date of Patent: Aug. 8, 2023

(54) ELECTRONIC COMPONENT EVALUATION METHOD, ELECTRONIC COMPONENT EVALUATION DEVICE, AND ELECTRONIC COMPONENT EVALUATION PROGRAM

(71) Applicant: SUMIDA CORPORATION, Tokyo (JP)

(72) Inventors: Junji Morita, Natori (JP); Daichi Gemba, Natori (JP)

(73) Assignee: SUMIDA CORPORATION

( * ) Notice: Subject to any disclaimer, the term of this patent is extended or adjusted under 35 U.S.C. 154(b) by 38 days.

(21) Appl. No.: 16/861,552

(22) Filed: Apr. 29, 2020

(65) Prior Publication Data
US 2020/0359537 A1 Nov. 12, 2020

(30) Foreign Application Priority Data
May 10, 2019 (JP) .................................. 2019-089685

(51) Int. Cl.
*G06K 9/00* (2022.01)
*H05K 13/08* (2006.01)
(Continued)

(52) U.S. Cl.
CPC ......... *H05K 13/0812* (2018.08); *G01B 11/14* (2013.01); *G01N 21/9501* (2013.01);
(Continued)

(58) Field of Classification Search
CPC ....... G06T 7/0002; G06T 7/0004; G06T 7/50; G06T 7/60; G06T 7/70;
(Continued)

(56) References Cited

U.S. PATENT DOCUMENTS 5,168,217 A 12/1992 Sakaguchi
5,477,138 A * 12/1995 Erjavic ................ G01R 31/311
324/762.02
(Continued)

FOREIGN PATENT DOCUMENTS

CN 101943571 A 1/2011
CN 102233468 A 11/2011
(Continued)

OTHER PUBLICATIONS

Extended European Search Report for corresponding Application No. EP 20173087.6 dated Sep. 17, 2020 (10 pages).
(Continued)

*Primary Examiner* — Eric Rush
(74) *Attorney, Agent, or Firm* — Harness, Dickey & Pierce, P.L.C.

(57) ABSTRACT

An electronic component evaluation method is provided for evaluating an electronic component. The electronic component has a lower surface facing a mounting substrate, an upper surface having a flat main surface, and a plurality of mounting terminals configured to be mounted on the mounting substrate. The method includes the steps of: obtaining terminal position information of the plurality of mounting terminals; generating a reference plane including at least three of the plurality of mounting terminals in response to the terminal position information; and detecting a height of at least one of the upper surface or the lower surface relative to the reference plane.

18 Claims, 7 Drawing Sheets

(51) Int. Cl.
  *G06T 7/70* (2017.01)
  *H05K 13/04* (2006.01)
  *G06T 7/00* (2017.01)
  *G06T 7/60* (2017.01)
  *G01B 11/14* (2006.01)
  *G01N 21/95* (2006.01)
  *G01N 21/956* (2006.01)

(52) U.S. Cl.
  CPC .............. *G06T 7/0004* (2013.01); *G06T 7/60* (2013.01); *G06T 7/70* (2017.01); *H05K 13/0409* (2018.08); *G01N 2021/95661* (2013.01); *G06T 2207/30141* (2013.01); *G06T 2207/30164* (2013.01)

(58) Field of Classification Search
  CPC . G06T 2207/30108; G06T 2207/30141; G06T 2207/30164; H05K 13/04; H05K 13/0404; H05K 13/0409; H05K 13/0812; H05K 13/0815; H05K 13/083; G01B 11/03; G01B 11/06; G01B 11/0608; G01B 11/14; G01B 11/24; G01N 21/88; G01N 21/8803; G01N 21/9501; G01N 2021/95638; G01N 2021/95646; G01N 2021/95653; G01N 2021/95661
  USPC ........ 382/100, 106, 141, 144–147, 149–154, 382/195, 199, 203, 204, 209, 217–220, 382/224, 286, 287, 291; 29/592.1, 593, 29/700, 705, 720, 721, 739–741, 825, 29/829, 831–833, 837, 842, 846; 700/95, 700/108–110; 348/86, 87, 92–95, 125, 348/126, 128; 228/102–105; 356/237.1, 356/237.2, 237.5
  See application file for complete search history.

(56) References Cited

U.S. PATENT DOCUMENTS

| | | | | |
|---|---|---|---|---|
| 5,563,703 A * | 10/1996 | Lebeau | ............... | H05K 13/0813 382/146 |
| 5,628,110 A * | 5/1997 | Sakaguchi | ......... | H05K 13/0813 356/623 |
| 6,144,452 A * | 11/2000 | Hachiya | ............. | H05K 13/0812 356/615 |
| 6,243,164 B1 * | 6/2001 | Baldwin | .......... | G01N 21/95684 356/624 |
| 6,606,788 B1 * | 8/2003 | Morimoto | .......... | H05K 13/0813 29/827 |
| 6,710,445 B2 * | 3/2004 | Oh | .................... | G01N 21/95684 257/734 |
| 7,058,216 B2 * | 6/2006 | Kawada | ............. | H05K 13/0812 382/146 |
| 10,834,861 B2 * | 11/2020 | Ishikawa | ............ | H05K 13/0813 |
| 2002/0139473 A1 | 10/2002 | Fujii et al. | | |
| 2013/0033286 A1 * | 2/2013 | Huang | ................... | G01R 31/70 324/763.01 |
| 2013/0044204 A1 * | 2/2013 | Ishigaki | ........... | G01N 21/95684 348/86 |
| 2015/0022637 A1 * | 1/2015 | Saeki | .................... | G06T 7/0004 348/46 |
| 2017/0205224 A1 | 7/2017 | Taniguchi et al. | | |
| 2019/0346260 A1 | 11/2019 | Morita et al. | | |

FOREIGN PATENT DOCUMENTS

| | | |
|---|---|---|
| CN | 102331241 A | 1/2012 |
| CN | 106489061 A | 3/2017 |
| EP | 0 355 377 A1 | 2/1990 |
| JP | H01-284744 A | 11/1989 |
| JP | H04-15507 A | 1/1992 |
| JP | H07-139924 A | 6/1995 |
| JP | 2002-231797 A | 8/2002 |
| JP | 2003-065754 A | 3/2003 |
| JP | 2008-021680 A | 1/2008 |
| JP | 2010-073778 A | 4/2010 |

OTHER PUBLICATIONS

Chinese Office Action issued for corresponding Chine Application No. 202010349933.7; dated Aug. 25, 2021 (total 16 pages).

Office Action issued in the corresponding Japanese Patent Application No. 2019-089685; dated Feb. 7, 2023 (total 5 pages).

Decision to Grant a Patent issued in the corresponding Japanese Application No. 2019-089685; dated June 13, 2023 (total 5 pages).

* cited by examiner

ELECTRONIC COMPONENT EVALUATION METHOD, ELECTRONIC COMPONENT EVALUATION DEVICE, AND ELECTRONIC COMPONENT EVALUATION PROGRAM

CROSS-REFERENCE TO RELATED APPLICATIONS

This application claims priority to Japanese Patent Application No. 2019-089685 filed May 10, 2019, which is hereby expressly incorporated by reference herein in its entirety.

BACKGROUND

1. Technical Field

The present invention relates to an electronic component evaluation method, an electronic component evaluation device, and an electronic component evaluation program.

2. Related Art

In a mounting process in which an electronic component is mounted on a substrate (board), a work (operation) is performed by a robot. As part of the work performed by the robot, the electronic component is moved by an arm and is mounted on the substrate. A wiring member is printed on the substrate by a solder paste. Because the electronic component being mounted on the substrate with the wiring member is carried into, for example, a reflow furnace, the solder paste is melted. As a result, the electronic component is mechanically and electrically connected to (mounted on) the substrate.

As the robot explained above, for instance, there is a vacuum robot for picking and placing. Specifically, the vacuum robot has a suction pad at a tip of the arm that comes in contact with (abuts) the electronic component and sucks the air from an opening that is provided at the suction pad. Since the air is sucked from the opening of the suction pad, the electronic component is sucked (attached) to the suction pad. Further, once the suction of the air is stopped, the electronic component is separated from the suction pad. Further, as a device that mounts the electronic component, for instance, there is a chucking device that carries the electronic component while the chucking device holds the electronic component. When the above tasks are performed, both the vacuum robot and the chucking device perform the operations in which the electronic component on, for example, a workbench (work table) is moved by sucking or holding the electronic component and is separated from the vacuum robot and the chucking device onto the substrate.

The electronic component has a plurality of mounting terminals for mounting. The mounting terminals are inserted into holes formed in the substrate. In addition, there are many types of mounting terminals that are in surface contact (surface-contacted) with the substrate. With respect to the electronic component on which the mounting terminals are in surface contact with the substrate, because of the variations in, for example, a mounting angle of the mounting terminal with reference to a body of the electronic component or a bending condition of the mounting terminal, the upper and lower surfaces of the electronic component are sometimes inclined. When the vacuum robot sucks the upper surface of the electronic component in which the mounting terminals are under the conditions explained above, the electronic component is carried toward the substrate in the inclined state and the suction is released at the substrate. At this time, the electronic component may sometimes not be properly mounted on the substrate depending on a degree of the inclination. When the reflow of the electronic component under the inclined condition is performed as-is, the contact failure occurs because an electric resistance between the mounting terminals of the electronic component and the substrate wirings increases. The contact failure explained above easily occurs with respect to, for instance, a surface mounted coil component that has relatively a higher height (tall). A conventional surface mounting coil component is described in, for instance, Japanese Patent Publication Number 2010-73778.

In order to solve the problem regarding the contact failure explained above, a product inspection is conducted before an electronic component is mounted on a substrate. Specifically, before the electronic component is mounted, an inclination of the electronic component is measured in advance by measuring the heights of a plurality of points (locations) on an upper surface of the electronic component. Thereafter, the electronic component that has a large inclination is removed from the preparation of products because it is determined as to be "defective product." As the product inspection explained above, for instance, a height gauge in which a height of a contact point is measured with a high degree of accuracy by directly coming in contact with a measuring object can be used. In Japanese Patent Publication Number 2002-231797, it is described that a height of an electrostatic chuck member that is placed on a surface plate is measured by the height gauge.

However, in order to measure the inclination of the electronic component, because a measuring surface of the height gauge comes in contact with an end of the electronic component, a downward force is applied to the electronic component. As a result, there might be cases in which an accurate height cannot be measured because the inclination increases with respect to the electronic component that is already inclined prior to the height measurement. Further, when the electronic component is inclined and becomes stable at least in two states, there is a possibility that although the height is measured in one state, the electronic component is sucked or chucked (held) by the robot in the other state. In the above case, the height of the electronic component that is mounted cannot be accurately obtained by measuring the height using the height gauge. Further, when the suction or the chucking is performed in a state that is different from the state in which the height is measured, there is a possibility that the electronic component cannot be caught (picked up) due to the failure of the suction or the chucking (holding).

Further, when the measurement is conducted by the height gauge, it is necessary to have a process in which the measuring surface comes in contact with a measuring object after the measuring object is set on the surface plate. For this reason, with respect to the product inspection of the electronic component by using the height gauge, the inspection load is too large to inspect all components. As a result, a sampling inspection is usually performed.

SUMMARY

The present invention attempts to solve the above problems. An object of the present invention is to provide an electronic component evaluation method, an electronic component evaluation device, and an electronic component evaluation program. Specifically, the inspection of all items can be performed without directly coming in contact with the electronic component and with a small inspection load according to the measurement.

According to one aspect of the present invention, an electronic component evaluation method is for evaluating an electronic component for causing a processor to execute computer-readable instructions stored in a memory. The electronic component has a lower surface facing a mounting substrate, an upper surface having a flat main surface, and a plurality of mounting terminals configured to be mounted on the mounting substrate. The method includes the steps of: obtaining terminal position information of the plurality of mounting terminals; generating a reference plane in which at least three mounting terminals of the plurality of mounting terminals reside (are located) in response to the terminal position information; and detecting height information of a height of at least one of the upper surface or the lower surface relative to the reference plane.

According to another aspect of the present invention, an electronic component evaluation device is for evaluating an electronic component. The electronic component has a lower surface facing a mounting substrate, an upper surface having a flat main surface, and a plurality of mounting terminals configured to be mounted on the mounting substrate. The electronic component evaluation device includes a memory configured to store computer-readable instructions, and a processor configured to execute the computer-readable instructions so as to: obtain terminal position information of the plurality of mounting terminals; generate a reference plane on which at least three mounting terminals of the plurality of mounting terminals abut in response to the terminal position information; and detect height information of a height of at least one of the upper surface or the lower surface relative to the reference plane.

According to yet another aspect of the present invention, a computer program product is for embodying computer-readable instructions stored on a non-transitory computer-readable medium for causing a computer to execute a process by a processor for evaluating an electronic component. The electronic component has a lower surface facing a mounting substrate, an upper surface having a flat main surface, and a plurality of mounting terminals configured to be mounted on the mounting substrate. The computer program product includes executing on the processor the steps of: obtaining terminal position information of the plurality of mounting terminals; generating a reference plane on which at least three mounting terminals of the plurality of mounting terminals abut in response to the terminal position information; and detecting height information of a height of at least one of the upper surface or the lower surface relative to the reference plane.

According to the present invention, the electronic component evaluation method, the electronic component evaluation device, and the electronic component evaluation program in which the inspection of all components can be performed without directly coming in contact with the electronic component and with the small inspection load according to the measurement can be provided.

DESCRIPTION OF EXEMPLARY EMBODIMENTS

Figure 1:
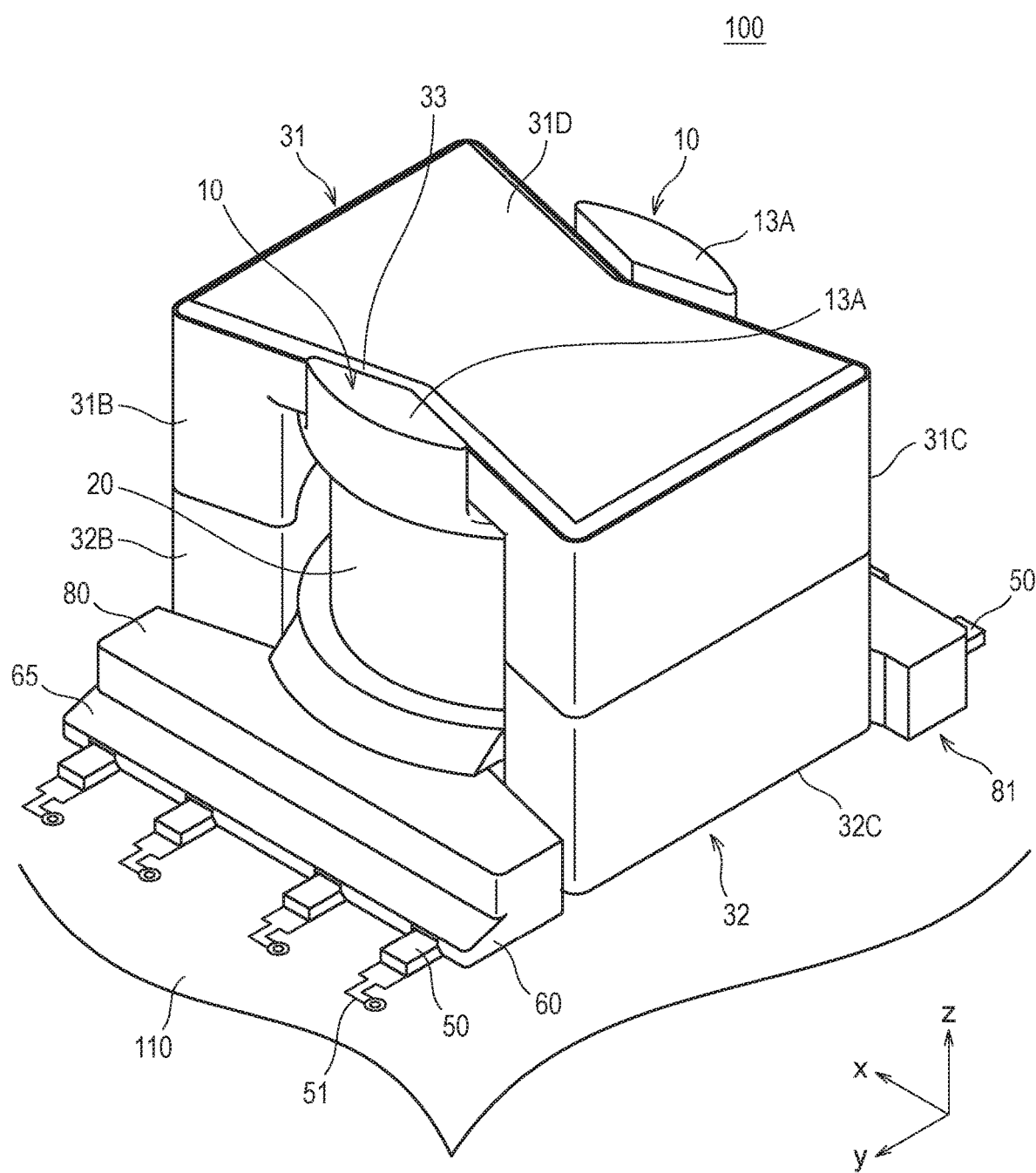
FIG. 1 is a perspective view that shows an electronic component according to an embodiment of the present invention.

Embodiments according to the present invention are explained below with reference to the drawings. In regards to the drawings, redundant explanations with respect to the same configurations are omitted but the same reference numerals are used for labeling. Further, because the drawings according to the embodiments are schematic diagrams for explaining, for instance, configurations, mechanisms, and operations of the embodiments, a size, a dimension, a shape, and an aspect ratio may not necessarily be shown precisely. Further, in the embodiments, a z-direction (a positive (+) z-direction) of x-, y-, and z-coordinate axes shown in FIG. 1 denotes "up" (upward, top or upper) and a negative (−) z-direction (not shown) that is opposite to a z-direction (the positive (+) z-direction) with respect to a z-coordinate axis denotes "down" (downward, bottom or lower). The negative z-direction is a direction toward a mounting substrate (board) on which the electronic component is mounted. Therefore, the words "up" or "down" relating to the configuration shown in FIG. 1 correspond to the upper part and lower part of the mounted electronic component.

Overview

According to an electronic component evaluation method according to one embodiment of the present invention, elements or factors relating to a shape, a structure, or a configuration of an electronic component that has a lower surface, an upper surface, and a plurality of mounting terminals are evaluated. Specifically, the lower surface faces toward a mounting substrate (mounting board) on which the electronic component is mounted via the mounting terminals. The upper surface has a flat principal (primary or main) surface. The plurality of mounting terminals are used for mounting the electronic component on the mounting substrate. Further, the electronic component evaluation method according to the present embodiment has a reference plane creation (generation) process and a height information detecting process. Specifically, in the reference plane creation process, based on terminal position information regarding positions of the mounting terminals, a reference plane that includes (comes in contact with) at least a part of the mounting terminals is created. Further, in the height information detecting process, with reference to the reference plane, the height information regarding a height of at least one of the upper and lower surfaces of the electronic component is detected. Note that the elements or factors relating to a shape, a structure, or a configuration (shape) of an electronic component are, for example, a height at a single point (location) or several points (locations) on the upper surface and/or the lower surface, a degree of inclination, and an inclination direction of the inclination of the upper surface and/or the lower surface of the electronic component.

Further, the electronic component is defined as a component that is configured with an element body and a mounting terminal(s). The element body is formed by packaging and sealing (encapsulating) a plurality of components that configure an electronic circuit. The mounting terminal(s) is provided at the element body to mechanically and electrically connect (mount) the element body to the mounting substrate. Mechanically and electrically connecting with the electronic component is referred to as mounting. The mounting substrate is referred to as a substrate (board) that is mechanically and electrically connected to the electronic component. The mounting terminal(s) is used for mounting the electronic component on the mounting substrate. For instance, a connecting (entwining) part to which a lead wire end as a winding end of a winding wire is connected is not included as a mounting terminal.

The height information regarding the height may be referred to as a distance from (relative to) the reference plane to the upper surface or the lower surface of the electronic component and any information regarding this distance. The height information may also be referred to as a degree of inclination of the upper surface or the lower surface of the electronic component with respect to the reference plane. The degree of inclination is obtained by a difference(s) between heights that are measures at a plurality of points (locations) on the upper surface or the lower surface of the electronic component. In addition, the height information may also be determined by an inclination direction toward a higher point or a lower point of the inclination of the upper surface or the lower surface of the electronic component.

The shape of the electronic component that is evaluated by the electronic component evaluation method according to the present embodiment refers to, for instance, as the inclination directions or the degrees of the inclinations of the upper and lower surfaces of the electronic component in addition to the height (of the upper and lower surfaces) of the electronic component (with respect to a reference plane). Terminal position information regarding a position(s) of the mounting terminal(s) refers to a height(s) of the mounting terminal(s) or a combination of the height and the position(s) of the mounting terminal(s). Further, the reference plane that comes in contact with (includes) at least three mounting terminals of the mounting terminals refers to a virtual plane that comes in contact (includes) with at least three measuring points on at least three mounting terminals, respectively. The reference plane explained above is a virtual mounting plane on which the electronic component is virtually mounted. The creation (generation) of the reference plane is performed by creating an arithmetic expression that denotes the plane explained above or creating a set of data that denotes points (locations) positioned on the plane. Further, the word or phrase "come in contact (contact or abut)" means that a point on the mounting terminal exists on the reference plane and does not mean that the point is located above or below the reference plane.

Electronic Component

Figure 2:
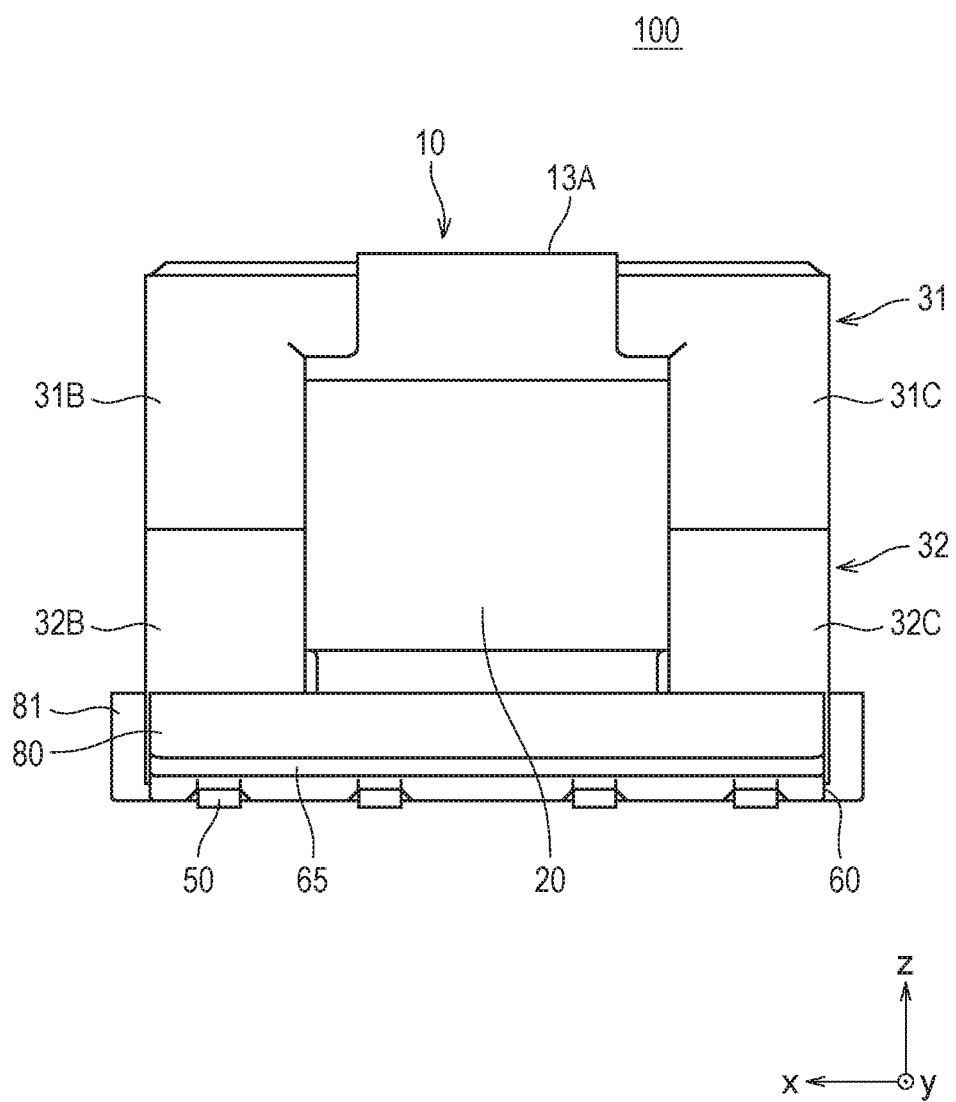
FIG. 2 is a front view that shows the electronic component shown in FIG. 1 according to the embodiment of the present invention.
Figure 3:
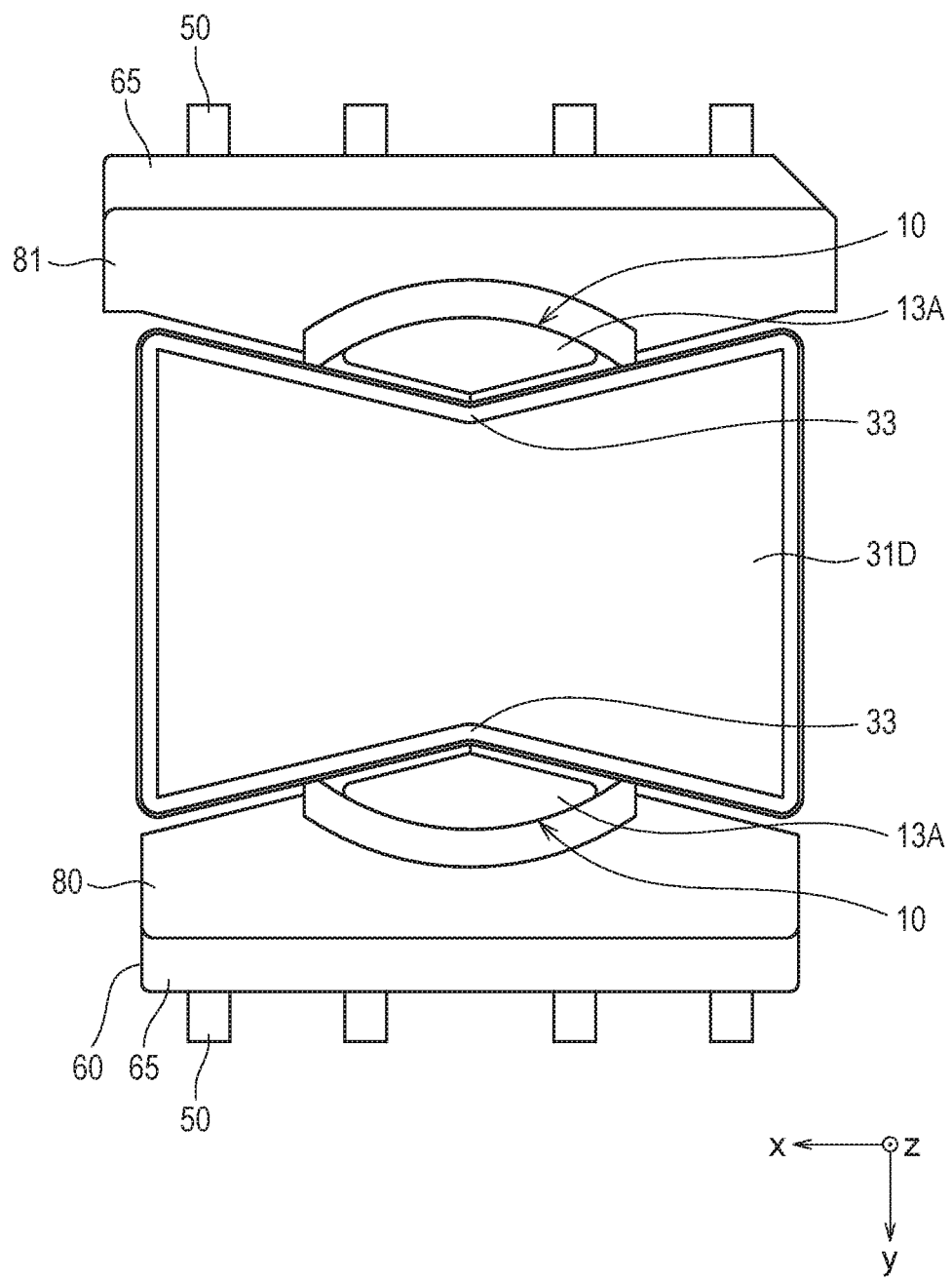
FIG. 3 is a top view that shows the electronic component shown in FIG. 1 according to the embodiment of the present invention.
Figure 4:
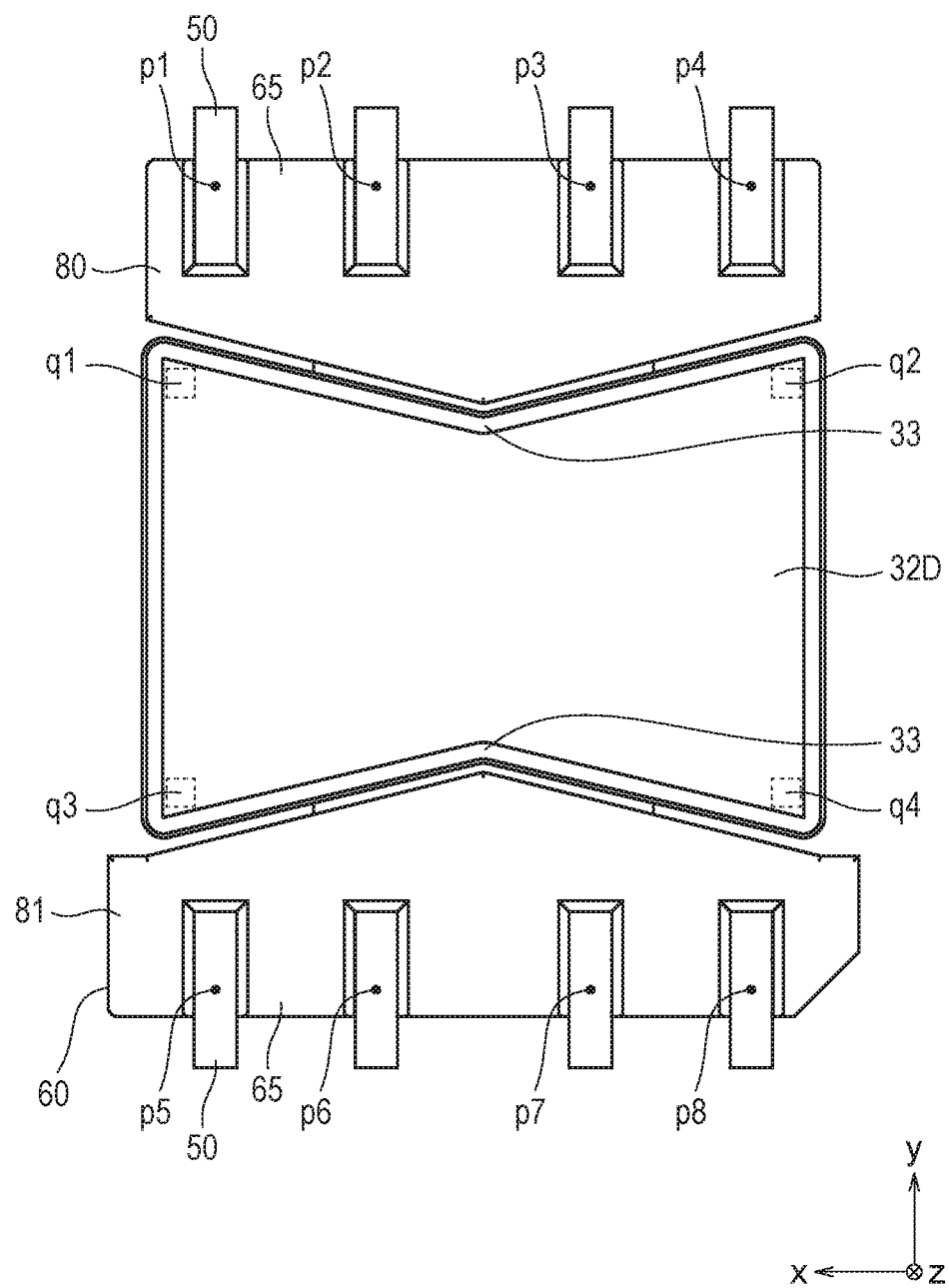
FIG. 4 is a bottom view that shows the electronic component shown in FIG. 1 according to the embodiment of the present invention.

FIG. 1 is a perspective view that shows an electronic component 100 according to an embodiment of the present invention. FIG. 2 is a front view that shows the electronic component 100 shown in FIG. 1 according to the embodiment of the present invention. FIG. 3 is a top view that shows the electronic component 100 shown in FIG. 1 according to the embodiment of the present invention. FIG. 4 is a bottom view that shows the electronic component 100 shown in FIG. 1 according to the embodiment of the present invention. Measuring points (locations) p1, p2, p3, p4, p5, p6, p7, and p8 and measuring points (locations) q1, q2, q3, and q4 shown in FIG. 4 are target measuring points (locations) for measuring heights by a three-dimensional (3D) camera 2 explained below. As explained below, the 3D camera 2 is configured by an imaging sensor, such as a CMOS sensor and a CCD sensor.

The electronic component 100 according to the present embodiment is configured with a bobbin 10, a coil 20, a first core member 31, a second core member 32, base members 80 and 81, a plurality of mounting terminals 50, and a terminal holding member 60. Specifically, the bobbin 10 has a winding section (not shown). The coil 20 is wound around an outer circumference of the winding section of the bobbin 10. The first core member 31 and the second core member 32 are made of ferrite and in E-types (are E-shaped). The first core member 31 and the second core member 32 are arranged at an upper position and a lower position of the electronic component 100 so as to sandwich the bobbin 10. A lead wire end as a winding end (not shown) of the coil 20 is connected to at least one mounting terminal of the plurality of mounting terminals 50. The plurality of mounting terminals 50 are mounted on a mounting substrate (mounting board) 110. The terminal holding member 60 formed of an insulating material holds the plurality of mounting terminals 50 that are arranged in parallel to each other.

The first core member 31 has outer leg parts 31B and 31C, and an upper base part 31D as shown in FIG. 1. Specifically, the plate-like upper base part 31D is connected between the outer leg parts 31B and 31C. The second core member 32 has outer leg parts 32B and 32C, and a lower base part 32D (shown in FIG. 4).

Specifically, the plate-like lower base part 32D is connected between the outer leg parts 32B and 32C. The upper base part 31D corresponds to the upper surface of the electronic component 100 and has a flat principal (primary or main) plane according to the present embodiment. The lower base part 32D is the lower surface of the electronic component 100. The lower surface (the lower base part 32D) has a flat principal (primary or main) plane relative to the upper surface.

The first core member 31 and the second core member 32 are assembled while sandwiching the bobbin 10 and the base members 80 and 81 from above and below (up and down directions) in the drawings. The base members 80 and 81 are integrally formed to be a single unit by a resin material that has an insulating property. The mounting terminals 50 are pressed toward the mounting substrate 110 by a presser (pressing member) 65 and are electrically connected to printed wirings 51 that are formed on the mounting substrate 110.

Further, in FIGS. 1-4, a length along an X-direction of the base member 81 is longer than a length along the X-direction of the base member 80. See the x-, y-, and z-coordinate axes in FIGS. 1-4.

The bobbin 10 is a vertical installation (setting) type that is used for an inductor or a transformer. Further, the bobbin 10 has a winding section (not shown) having a cylindrical shape and a flange part 13A. Specifically, the flange part 13A is provided at the upper end of the winding section in the drawings. Further, an outer edge of the flange part 13A is formed into a circular shape. The coil 20 is wound around the outer circumference of the winding section. The coil 20 is configured by a plurality of wires including a primary winding and a secondary winding. Further, the base member 80 is provided at the lower end of the winding section in the drawings. The base member 80 is a flat plate having an outer edge formed into a rectangular shape. The base member 80 also serves as a flange part at a lower side of the winding section. A narrow width part 33 is formed in the upper base part 31D. The flange part 13A engages with the narrow width part 33. The coil 20 is fitted into the first core member 31 and the second core member 32. The bobbin 10 is assembled into the first core member 31 and the second core member 32.

Electronic Component Evaluation Device

Figure 5:
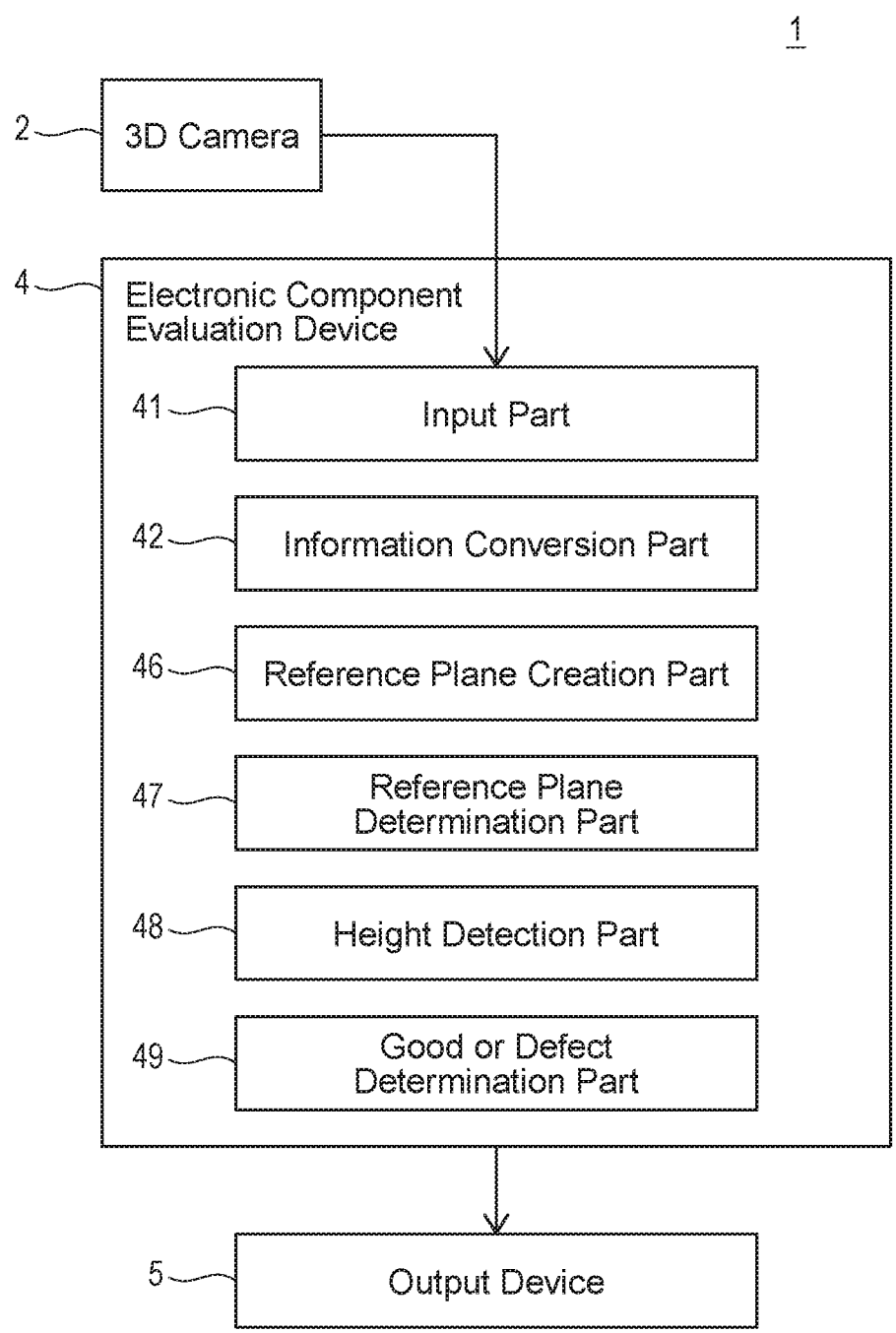
FIG. 5 is a block diagram that shows an electronic component evaluation system that has an electronic component evaluation device according to the embodiment of the present invention.
Figure 6:
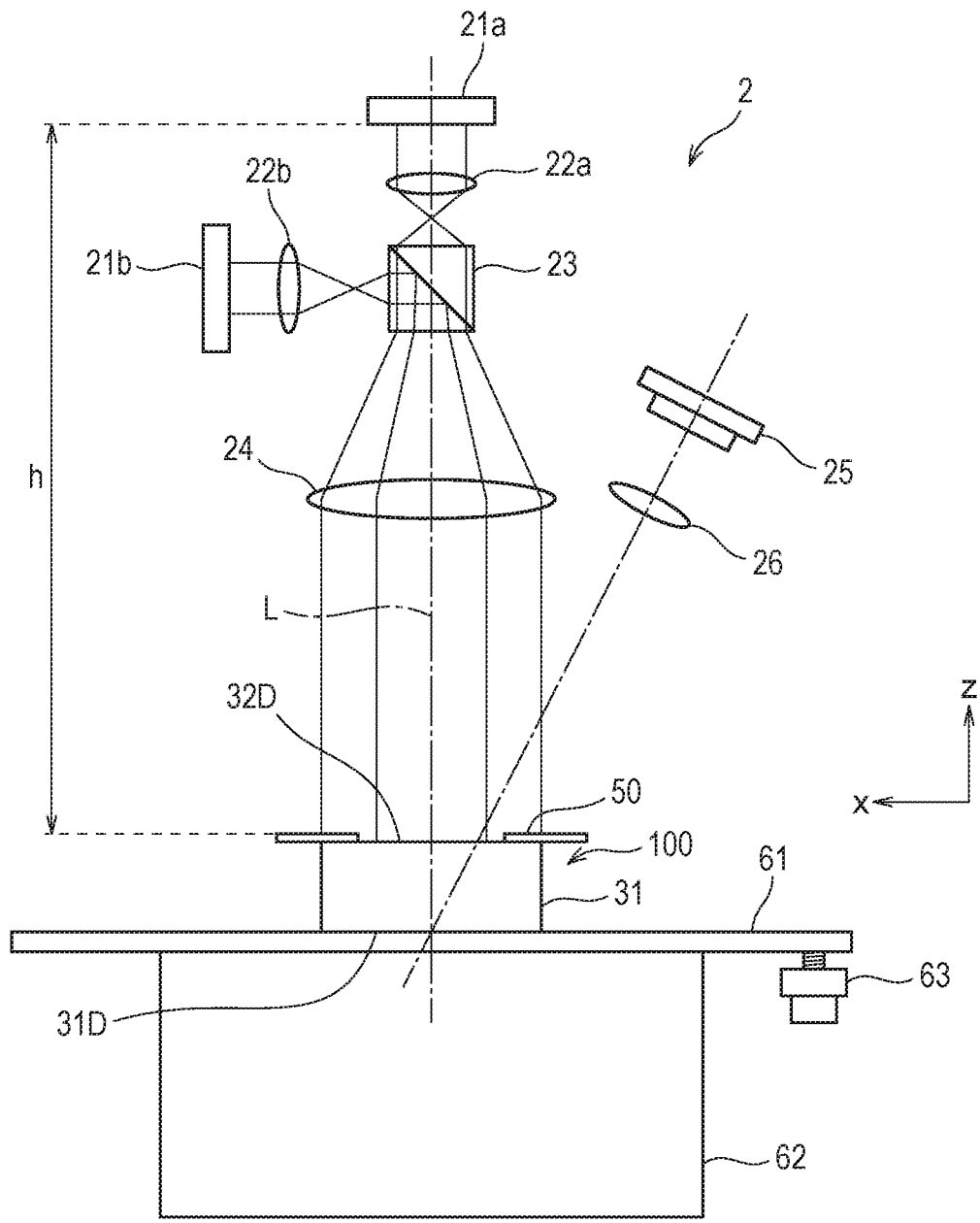
FIG. 6 is an explanatory diagram that shows a three-dimensional (3D) camera shown in FIG. 5 according to the embodiment of the present invention.

FIG. 5 is a block diagram that shows an electronic component evaluation system 1 that has an electronic component evaluation device 4 according to the embodiment of the present invention. FIG. 6 is an explanatory diagram for explaining a three-dimensional (3D) camera 2 shown in FIG. 5 according to the embodiment of the present invention. The electronic component evaluation device 4 shown in FIG. 5 evaluates the shape (elements or factors relating to a shape, a structure, or a configuration (See paragraph [0022])) of the electronic component 100 shown in FIGS. 1-4. The electronic component evaluation system 1 is configured with the electronic component evaluation device 4, the 3D camera 2, and an output device 5.

As shown in FIG. 5, the electronic component evaluation device 4 is configured with an input part (module) 41, an information conversion part (module) 42, a reference plane creation (generation) part (module) 46, a reference plane determination part (module) 47, a height detection part (module) 48 that is a height information detection part (module), and a good or defect (pass/fail quality control) determination part (module) 49. The height detection part (module) 48 detects the information regarding the height of at least one of the principal surface (simply described as "the lower base part 32D" below) of the lower base part 32D and the principal surface (simply described as "the upper base part 31D" below) of the upper base part 31D of the electronic component 100 with reference to the reference plane.

In the configuration shown in FIG. 5, the input part (module) 41, the information conversion part (module) 42, the reference plane creation (generation) part (module) 46, the reference plane determination part 47, the height detection part (module) 48, and the good or defect (pass/fail quality control) determination part (module) 49 are controlled by a CPU or a processor (not shown) and a memory (not shown). The memory is, for example, a RAM, a ROM, an EPROM, an EEPROM, a hard disk, an optical disk, or the like. The CPU or processor is configured to execute a program or computer-readable instructions stored in the memory so as to perform functions and operations conducted in each of the above parts (modules) of the electronic component evaluation device 4. Further, the CPU or processor may be configured to execute the program or computer-readable instructions stored in the memory so as to control the 3D camera 2 and/or the output device 5.

As shown in FIG. 6, the 3D camera 2 images (captures an image of) the electronic component 100 that is placed on a table having a base 62 and a top plate 61 from the upper side of (from above) the top plate 61. For instance, the top plate 61 may be configured to be movable in one direction so that a plurality of the electronic components 100 that are located on the top plate 61 to align with the moving direction are sequentially imaged and inspected. According to the configuration explained above, in the present embodiment, the inspection of the electronic components 100 can be conducted in a short period of time in the same manner as an assembly line. A height of the top plate 61 can be changed by an elevating and lowering screw (lifting screw) 63. As a result, it is possible to focus the 3D camera 2 onto the measuring point of the electronic component 100 regardless of the height of the electronic component 100.

3D Camera

The electronic component 100 is placed on the top plate in a state in which the upper base part 31D comes in contact with the top plate 61. Thus, the lower base part 32D faces toward the 3D camera 2 located at an upper part. The 3D camera 2 is configured with a light source 25, a projection lens unit 26, a condenser lens unit 24, a half mirror 23, CMOS sensors (Complementary Metal Oxide Semiconductor Sensors) 21a and 21b, and imaging lenses 22a and 22b. Specifically, the light source 25 obliquely projects (emits) a stripe-like line light to the electronic component 100. The projection lens unit 26 concentrates the line light being projected (emitted) on the lower base part 32D of the electronic component 100. The condenser lens unit 24 condenses the line light reflected from the lower base part 32D and guides the condensed reflection line light to the half mirror 23. The CMOS sensors 21a and 21b form an image in response to the light guided to the half mirror 23. The imaging lenses 22a and 22b are located between the half mirror 23 and the CMOS sensors 21a and 21b, respectively, and make the light from the half mirror 23 parallel light. The 3D camera 2 has the two CMOS sensors 21a and 21b. Therefore, one of the CMOS sensors 21a and 21b generates a low-magnification image in which an entirety of the electronic component 100 can be imaged and the other of the CMOS sensors 21a and 21b generates a high-magnification image in which part(s) of the electronic component 100 can be observed. In the present embodiment, the high-magnification image is imaged by the CMOS sensor 21a.

Further, with respect to the system explained above, the electronic component 100 may be imaged from two different directions by two sets of the 3D cameras so that a shadow area on the image is not generated.

According to the configuration of the present embodiment explained above, the images that are formed on the CMOS sensors 21a and 21b are output to the information conversion part (module) 42 of the electronic component evaluation device 4 as imaging data via the input part (module) 41. However, the 3D camera 2 according to the present embodiment is not limited to the configuration in which the imaging data is output as explained above. For instance, the 3D camera 2 may have a range-finding part (not shown) that finds a coordinate of the measuring point in the imaging data and outputs the position information that is measured by the range-finding part to the electronic component evaluation device 4.

Further, in the present embodiment, distances between the 3D camera 2 and each of the measuring points p1-p8 of the mounting terminals 50, and distances between the 3D camera 2 and each of the measuring points q1-q4 of the lower base part 32D are measured by a TOF (Time Of Flight) method. With respect to the 3D camera 2 explained above, the range-finding part (not shown) detects a period of time starting from projecting (emitting) the line light to the electronic component 100 by the light source 25 and ending when the reflected light is imaged/received by the CMOS sensors 21a and 21b with a predetermined number of pixels of the corresponding captured image(s) of the electronic component. In the present embodiment, the 3D camera 2 continuously projects (emits) the stripe-like line lights toward the measuring points (locations; p1-p8 and q1-q4)

and records each period of time (from projecting the lights until receiving the lights) corresponding to each line light at the respective measuring points (locations; p1-p8 and q1-q4).

The detected period of time is input into the information conversion part (module) 42 via the input part (module) 41. However, the present embodiment is not limited to the configuration in which the period of time starting from projecting the line light and ending when the reflected light is received is input into the electronic component evaluation device 4. The range-finding part (not shown) may convert the period of time into a distance and output the converted distance to the electronic component evaluation device 4.

Further, in the TOF method, a phase delay of the reflected light with respect to the projecting (emitting) light may be measured when the line light is a high-speed pulse light. However, the present embodiment is not limit to obtaining the height information by using the TOF method. So long as the height information is obtained from the imaging data, the height information may be obtained by other methods such as a triangular range finding system (trigonometric range finding system).

Information Conversion Part (Module)

The input part (module) 41 inputs the height information of the measuring points (locations) p1-p8 and the measuring points (locations) q1-q4 that are obtained by the measurement mentioned above by using the 3D camera 2. For instance, the information conversion part (module) 42 detects each edge of the mounting terminals 50 from the imaging data and detects each outermost periphery of the mounting terminals 50 from the detected edges. Thereafter, the information conversion part (module) 42 determines a specific pixel of the imaging data (the captured image) that is spaced apart from a predetermined pixel of the imaging data (the captured image) with a predetermined distance in a predetermined direction as each of the measuring points (locations) p1-p8 of the mounting terminals 50. Further, in the present embodiment, as shown in FIG. 4, the measuring points p1-p8 are center points of the mounting terminals 50. However, the present embodiment is not limited to this configuration. Each of the measuring points p1-p8 may be an end (edge) part, a highest height part, or a lowest height part of the mounting terminals 50.

Similarly, the information conversion part (module) 42 detects an edge of the lower base part 32D from the imaging data and detects an outermost periphery of the first core member 31 from the detected edge. Thereafter, the information conversion part (module) 42 determines a specific pixel of the imaging data (the captured image) that is spaced apart from a predetermined pixel of the imaging data (the captured image) with a predetermined distance in a predetermined direction as each of the measuring points (locations) q1-q4 of the mounting terminals 50. The measuring points q1-q4 are not limited to the points shown in FIG. 4. Thus, the measuring points q1-q4 may be arbitrary points on the lower base part 32D. However, in order to detect a degree or a direction, or the like of an inclination of the lower base part 32D, it is preferred that the measuring points are located at the edge of the lower base part 32D as shown in FIG. 4.

Further, the information conversion part (module) 42 calculates the coordinates of the measuring points based on the directions of the pixels (of the imaging data) corresponding to the measuring points and the distances from the 3D camera 2 to the measuring points corresponding to the pixels. Further, the information conversion part (module) 42 calculates a phase difference (delay) being generated by a time difference starting from projecting (emitting) the line light and ending when the line light is received that is projected to the measuring point among the stripe-like line lights. As a result, the information conversion part (module) 42 calculates a distance h from the surface of the electronic component 100 to the CMOS sensor 21a. The distance h corresponds to lower surface position information according to the present embodiment. Further, the information conversion part (module) 42 may mask rear surfaces (parts being integrated with the bobbin 10) of the base members 80 and 81 when the information conversion part (module) 42 performs the data processing (calculation) regarding the measuring points q1-q4. In this case, the masking means that the rear surfaces of the base members 80 and 81 are excluded from the data processing (calculation) and only the surface of the lower base part 32D is the calculation target.

Reference Plane Creation Part (Module)

The reference plane creation (generation) part (module) 46 obtains the position information (the terminal position information) of the mounting terminals 50 from the imaging data (captured image) that is imaged by the 3D camera 2 and creates a reference plane. The reference plane creation part (module) 46 according to the present embodiment creates a virtual reference plane by the position information (a two-dimensional coordinate and a height) of at least three measuring points (selected measuring points) of the measuring points p1-p8 on the mounting terminal 50. The three selected measuring points can be arbitrary points so long as each of the three selected measuring points is positioned on a different one of the three mounting terminals 50. For instance, each of the three selected measuring points can be positioned at the center or at the edge on each of the mounting terminals 50. In addition, each of the three selected measuring points on the mounting terminals 50 may be positioned at the same places (locations) on the mounting terminals 50 or may be positioned at the different places (locations) such as the highest height place or the lowest height place of the mounting terminal 50.

Reference Plane Determination Part (Module)

The reference plane determination part (module) 47 determines whether a plurality of reference planes that are created by the reference plane creation part (module) 46 are the reliable reference planes or invalid planes. According to the present embodiment, the reference plane is obtained by simulating a surface of the mounting substrate on which the electronic component 100 is properly mounted. In other words, the reference plane substantially corresponds to the surface of the mounting substrate on which the electronic component 100 is mounted. There is also a case in which the reference plane is not a single plane. But, the plurality of reference planes can exist depending on, for example, a direction in which the electronic component 100 is placed or a gravitational center position of the placement state of the electronic component 100 when the electronic component 100 is placed. An invalid plane(s) is obtained by eliminating the reference plane that is determined to be the reference plane by the reference plane determination part (module) 47 from all of the reference planes being created by the reference plane creation part (module) 46.

The reference plane determination part (module) 47 calculates the height information of the (non-selected) measuring points of the mounting terminals 50 that do not have the three selected measuring points based on each of the plurality of reference planes being created by the reference plane creation part (module) 46. As a result, with reference to one reference plane, when the mearing point is located at a further location from the electronic component 100 as compared to this reference plane, in other words, when the calculation result in which the mounting terminal 50 protrudes further than this reference plane in the negative z-direction shown in FIG. 1 (described as "is located lower" below) is obtained, the reference plane determination part (module) 47 determines that this reference plane is an invalid plane. The reference plane being determined to be the invalid plane is excluded from the plurality of reference planes that are created by the reference plane creation part (module) 46.

When the measuring points p1-p8 are located lower than the reference plane, the terminal of the electronic component 100 is buried into the mounting surface of the mounting substrate (mounting board) 110 at the time of the mounting. That is why the process explained above is performed. As shown in FIG. 1, the present embodiment is applied to the mounting terminals 50 that are in surface contact (surface-contacted) with the mounting substrate 110. Therefore, the above reference plane is determined to be an invalid plane because the mounting terminal(s) 50 cannot be buried into the mounting surface 110.

In other words, with respect to an actual mounting process, it is impossible that the terminal is embedded (buried) into the mounting surface 110. Therefore, a reference plane that has the calculation result, in which any of the measuring points p1-p8 is located lower than the reference plane, is different from the actual mounting surface in the actual mounting process. In order to obtain the mounting surface conforming with an actual mounting state, a reference plane that has the calculation result explained above is excluded from the reference planes by the reference plane determination part (module) 47.

In the present embodiment, when the height information shows that the measuring points p1-p8 are located lower than the reference plane, it is also described that the mounting terminal 50 corresponding to this measuring point is lower than the reference plane. On the contrary, in the present embodiment, when the height information shows that the measuring points p1-p8 are located higher than the reference plane, it is also described that the mounting terminal 50 corresponding to this measuring point is higher than the reference plane. When the mounting terminal 50 is higher than the reference plane, the mounting terminal 50 is in a "rising" (lifting or floating) state between the electronic component 100 and the mounting surface. In other words, the mounting terminal 50 that is located higher than the reference plane is spaced apart from the mounting surface of the mounting substrate (board) 110.

Further, in the above explanations, the negative z-direction of the x-, y-, z-coordinate axes shown in FIG. 1 denotes low, lower, or below (downward). In the present embodiment, the height is measured in the state in which the side of the lower base part 32D of the electronic component 100 faces upward (faces the 3D camera 2 as shown in FIG. 6). As a result, when the mounting terminal 50 is located higher than the reference plane during measurement (in the state shown in FIG. 6), the reference plane is determined to be invalid by the reference plane determination part (module) 47.

Further, in the present embodiment, in order to reduce the calculation loads of the reference plane determination part (module) 47, preprocessing may be performed prior to the creation of the reference planes. In the preprocessing, the reference planes, which are determined to be valid or invalid, are pre-selected (pre-classified) in advance according to locational relationships between positions of the actual electronic component 100 that are measured and positions of the designed electronic component 100 that are defined in designing. Specifically, for instance, a virtual triangle is created by selecting three measuring points from the measuring points p1-p8. Thereafter, it is determined whether a center of gravity (centroid point) of the electronic component 100 in designing is included or not in the created triangle. When the center of gravity is not included in the created triangle, this triangle is determined to be invalid because the created triangle is greatly different from the position information in designing. According to the preprocessing, it is possible that the number of reference planes that are determination targets by the reference plane determination part (module) 47 is reduced so that the calculation loads in the processes of the reference plane determination part (module) 47 are reduced.

Height Detection Part (Module)

The height detection part (module) 48 obtains the lower surface position information regarding to the positions of the plurality of measuring points q1-q4 of the lower base part 32D that are created by the information conversion part (module) 42. Further, the height detection part (module) 48 detects the height information that shows the height(s) of the lower base part 32D with reference to the reference plane from the lower surface position information. For instance, the detection of the height information can be performed by subtracting a distance h2 from a distance h1. Specifically, the distance h1 is a distance between the measuring point q1 of the lower base part 32D facing upward during the measurement and the CMOS sensor 21a. The distance h2 is a distance between the reference plane and the CMOS sensor 21a. Further, in the present embodiment, a height(s) of the upper base part 31D with reference to the reference plane at the time of mounting may be obtained by adding the height of the lower base part 32D and a sum of the heights in designing of the first core member 31 and the second core member 32.

In addition, as explained below, in the present embodiment, after the heights of at least two measuring points of the measuring points q1-q4 of the lower base part 32D are measured, a height difference between the measured heights of the two measuring points can be deemed to be an inclination of the lower base part 32D. In this case, in the present embodiment, the upper base part 31D has the same inclination as the lower base part 32D.

In other words, with respect to the first core member 31, the second core member 32, and the bobbin 10 of the electronic component 100, it is known that the variations of their shapes and configurations is sufficiently small and the assembling accuracy of them is high. Therefore, in the present embodiment, the obtained (calculated) height of the upper base part 31D discussed above that is obtained based on the height of the lower base part 32D with reference to the reference plane of the electronic component 100 is deemed to sufficiently correspond to an actual height for the inspection of the electronic component 100.

Good or Defect (Pass/Fail Quality Control) Determination Part (Module)

The good or defect (pass/fail quality control) determination part (module) 49 evaluates elements or factors relating to a shape, a structure, or a configuration of the electronic component 100 in response to the height information. In the present embodiment, the good or defect determination part (module) 49 evaluates a degree of inclination of the upper base part 31D or the lower base part 32D of the electronic component 100 based on a difference value between the maximum value and the minimum value of the height information that is measured with respect to the single electronic component 100. For instance, in the present embodiment, the degree of the inclination of the upper base part 31D can be obtained by calculating the difference value between a height (the maximum value) of a measuring point (for instance, the measuring point q1) that has a largest difference value as compared with the reference plane and a height (the minimum value) of a measuring point (for instance, the measuring point q4) that has a smallest difference value as compared with the reference plane.

Further, when the degree of the inclination exceeds a predetermined allowance range that is defined in advance, the good or defect determination part (module) 49 determines that the electronic component 100 having the exceeded degree of inclination is a defective product. When the difference value is within a predetermined allowance range that is defined in advance, the good or defect determination part (module) 49 determines that the electronic component 100 having the difference value within the range is a good product. However, the present embodiment is not limited to these configurations explained above. For instance, the good or defect determination part (module) 49 can determine whether the electronic component 100 is good or defective based on a mean value of the heights of the measuring points q1-q4 with reference to the reference plane. Further, the good or defect determination part (module) 49 can determine whether the electronic component 100 is good or defective based on the maximum value or the minimum value of the measuring points q1-q4 with reference to the reference plane.

Further, in the present embodiment, because the good or defect determination part (module) 49 determines whether the electronic component 100 is good or defective with a sufficient margin, all heights of the measuring points q1-q4 are measured with reference to each of a plurality of reference planes when the plurality of reference planes with respect to the single electronic component 100 are obtained. Thereafter, the good or defect determination part (module) 49 determines whether the single electronic component 100 is good or defective based on a difference value between the maximum value and the minimum value among the measured heights of the measuring points q1-q4 with respect to the plurality of reference planes.

As a result, the electronic component 100 is evaluated (inspected) (whether the single electronic component 100 is good or defective) based on a threshold, for example, a possible largest difference between the maximum and minimum heights and/or a possible maximum degree of inclination. Therefore, the reliability of the inspection can be enhanced.

Further, the good or defect determination part (module) 49 can evaluate an inclination direction of the inclination of the lower base part 32D or the upper base part 31D based on the height information of at least two measuring points of the measuring points q1-q4 and a positional relationship between the at least two measuring points. Specifically, for instance, when a height difference δ1 between the measuring points q1 and q2 is calculated, the good or defect determination part (module) 49 determines that an inclination 61 is generated in a direction along a linear line connecting between the measuring points q1 and q2 of the lower base part 32D. Similarly, for instance, when a height difference δ2 between the measuring points q2 and q3 is calculated, the good or defect determination part (module) 49 determines that an inclination 62 is generated in a direction along a linear line connecting between the measuring points q2 and q3 of the lower base part 32D. Thus, in the present embodiment, the inclinations of the lower base part 32D of the electronic component 100 can be calculated for every possible direction of linear lines connecting between every two measuring points of the measuring points. Further, in the present embodiment, it may be appropriate that the same inclination in the same direction as the lower base part 32D is also generated on the upper base part 31D.

The electronic component evaluation device 4 explained above includes hardware and software (program and computer-readable instructions). Specifically, the hardware devices are, for example, a CPU (Central Processing Unit) or a processor, and a memory device. The CPU (or processor) controls the entire functions or operations of the input part (module) 41, the information conversion part (module) 42, the reference plane creation part (module) 46, the reference plane determination part (module) 47, the height detection part (module) 48, and the good or defect determination part (module) 49 explained above. The CPU (or processor) can also control the 3D camera 2 and/or the output device 5. The memory device stores various data, a program, and computer-readable instructions that are used for the control by the CPU (or processor), and/or are used as a work memory of the CPU (or processor). Thus, the CPU (or processor) is configured to execute the program and/or the computer-readable instructions to control the above various parts (modules) 41, 42, 46, 47, and 49, and additionally control the 3D camera 2 and the output device 5. The hardware device(s) may be dedicated for the functions or operations of the electronic component evaluation device 4 or may also be a general PC (personal computer). The memory device is, for example, a RAM, a ROM, an EPROM, an EEPROM, a hard disk, an optical disk, or the like.

When a general PC is used for the electronic component evaluation device 4, the information conversion part (module) 42, the reference plane creation part (module) 46, the reference plane determination part (module) 47, the height detection part (module) 48, and the good or defect determination part (module) 49 are realized by an electronic component evaluation program that evaluates the shape of the electronic component 100. This program makes the computer realize a reference plane creation function (the reference plane creation part (module) 46) and a height detection function (the reference plane determination part (module) 47 and the height detection part (module) 48). Specifically, with respect to the reference plane creation function, the reference plane that comes in contact with (includes) at least three terminals of the mounting terminals 50 is created by the terminal position information regarding the positions of the mounting terminals 50. With respect to the height detection function, the height information regarding at least one height of the upper surface (the upper base part 31D) or the lower surface (the lower base part 32D) of the electronic component 100 with reference to the reference plane(s). The terminal position information and height information can be stored in the memory device mentioned above as data.

The output device 5 outputs a determination result that is determined by the good or defect determination part (module) 49. The output device 5 has, for instance, a display screen (not shown) that displays an image (the imaging data of the 3D camera 2) of a measuring target surface of the electronic component 100 that is subject to the evaluation (inspection). Further, the display screen also displays the determination results, such as "good (or OK)," "defect (or NG)," and "re-measurement or error (or ER)." Further, the output device 5 has a control panel (not shown). Specifically, the control panel controls ON and OFF operations of the electronic component evaluation device 4, and the determination of a good component or a defective component and the imaging operation (capturing an image by the 3D camera 2) of the electronic component 100. The above described CPU (or processor) may also be configured to control the above described functions or operations performed by the control panel and the display screen of the output device 5.

In addition, in the present embodiment, it is also possible that elements or factors other than the inclinations of the upper base part 31D and the lower base part 32D of the electronic component 100 are evaluated by using the data being obtained in the evaluation processes of the shape of the electronic component 100 based on the height information of the electronic component 100. As the evaluation elements or factors other than the inclination, for instance, a height of the mounting terminal 50, an angle of a bent part of the mounting terminal 40, and a distance between the mounting terminals 50 can be considered. Further, the output device 5 and/or the electronic component evaluation device 4 may determine whether a component is good or defective based on these evaluation elements or factors by comparing them with designed values that are defined in advance. Data or values relating to the design can be stored in the memory device in advance.

Electronic Component Evaluation Method

Next, an electronic component evaluation method that is performed by the electronic component evaluation system 1 explained above will be explained below.

Figure 7:
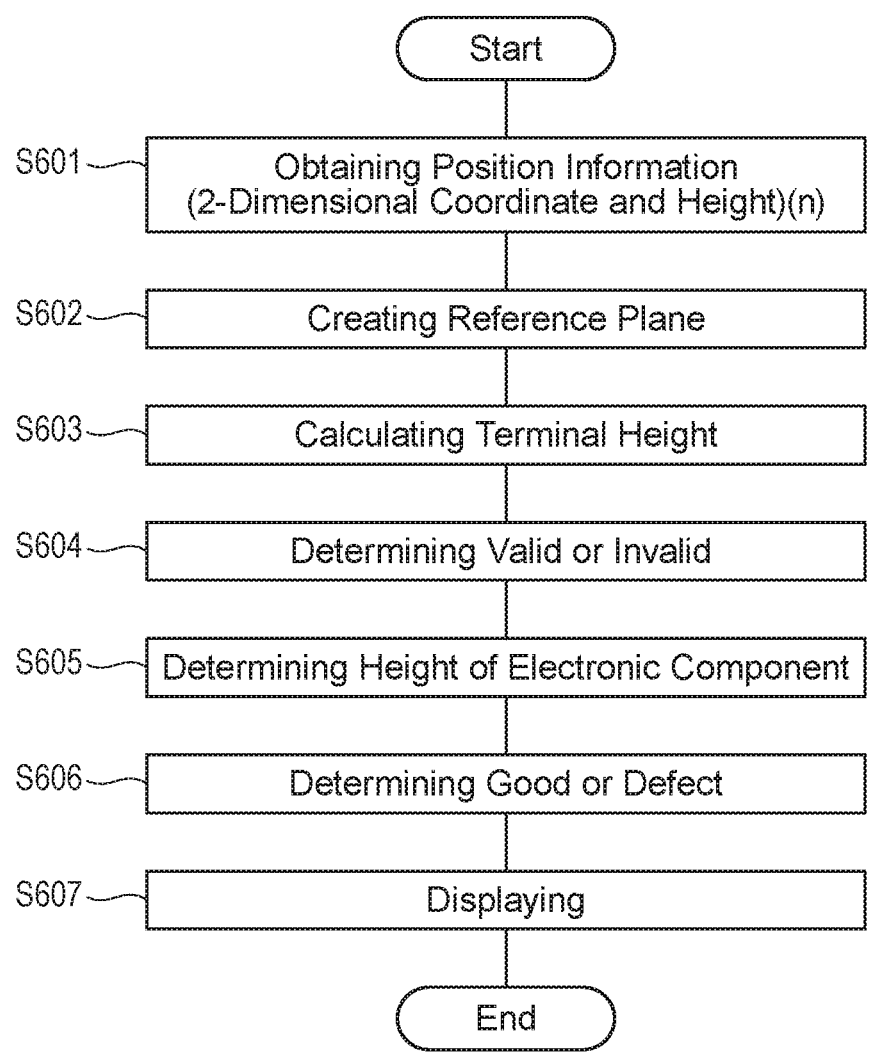
FIG. 7 is a flow diagram that shows an electronic component evaluation method according to the embodiment of the present invention.

FIG. 7 is a flow diagram for explaining an evaluation method of the electronic component 100 according to the embodiment of the present invention. The flow diagram shown in FIG. 7 has a reference plane creation process (step S602) and a height detection process (steps S601, S602, S603, S604, and S605). Specifically, with respect to the reference plane creation process (step S602), a reference plane that comes in contact with (includes) the at least three mounting terminals of the mounting terminals 50 is created by the terminal position information regarding positions of the mounting terminals 50. With respect to the height detection process (steps S601, S602, S603, S604, and S605), heights that corresponds to at least one of a distance between the reference plane and the upper base part 31D, or a distance between the reference plane and the lower base part 32D of the electronic component 100 are detected. The processes explained above are performed by the electronic component evaluation program in the electronic component evaluation device 4. In other words, as mentioned above, the CPU (or processor) is configured to execute the program or computer-readable instructions to perform the above processes in the electronic component evaluation method.

Specifically, in step S601, the input part 41 inputs the time data relating to a period of time starting from projecting (emitting) the light and ending when the light is received along with the imaging data (captured image) from the 3D camera 2. The information conversion part 42 obtains the time data of "n" mounting terminals based on the imaging data.

Specifically, the "n" mounting terminals are eight measuring points p1-p8 of the eight mounting terminals 50. The information conversion part 42 converts the time data of the eight measuring points p1-p8 into the lower surface position information. In addition, the information conversion part 42 obtains the time data of the measuring points q1-q4. The information conversion part 42 converts the time data of the measuring points q1-q4 into the lower surface position information (step S602).

At this time, it is preferred that the 3D camera 2 images the measuring points p1-p8 and the measuring points q1-q4 at the same time. However, in the present embodiment, the 3D camera 2 can image the measuring points p1-p8 at a first timing and image the measuring points q1-q4 at a second timing different from the first timing. Thus, the 3D camera 2 images two different images. As a result, the position information can be obtained from one image (data) of the measuring points p1-p8 and another image (data) of the measuring points q1-q4.

Next, the reference plane creation part 46 creates the reference plane by the selected three measuring points among the measuring points p1-p8. In the present embodiment, fifty-six (56) reference planes are created by the combinations of $_8C_3$ (step S602).

Next, the reference plane determination part 47 calculates the heights of the eight mounting terminals 50 with reference to the created fifty-six reference planes (step S603). Based on the calculated heights, the reference plane determination part 47 determines the reference plane that is located higher than at least one of the mounting terminals 50 at the time of the mounting as an invalid reference plane. On the other hand, the reference plane determination part 47 determines the reference plane that comes in contact with (includes) the mounting terminal 50 or is located lower than the mounting terminal 50 at the time of the mounting as a valid reference plane (step S604). The height detection part 48 calculates all of the heights of the measuring points q1-q4 with reference to each of the valid reference planes with respect to the single electronic component 100. Further, the height detection part 48 calculates a difference value between the minimum value and the maximum value among the calculated heights.

Next, when the calculated difference value exceeds an allowance range, the good or defect determination part 49 determines that the electronic component 100 is a defective product (NG). When the calculated difference value is within the allowance range, the good or defect determination part 49 determines that the electronic component 100 is a good product (OK) (step S606). The good or defect determination part 49 outputs the determination results (whether the electronic component 100 is a good product or a defective product) to the output device 5 so as to display them on a display screen (not shown) by the output device 5 (step S607).

The inventors of the present application measured a difference value between a maximum value and a minimum value of heights of measuring points being measured with respect to a single electronic component by the electronic component evaluation method according to the present embodiment explained above. When the plurality of reference planes with respect to the single electronic component exist, the maximum and the minimum values mean that the maximum and the minimum values of the heights of the measuring points with reference to all of the reference planes. Further, the inventors of the present application measured the maximum and the minimum values of the heights of the electronic component by the electronic component evaluation method according to the present embodiment by using the surface shape measurement system (surface metrology system) TMS-100 TopMap Metro. Lab (product name; manufactured by Polytec Japan, Ltd.). The measured values and their tendencies measured by the electronic component evaluation method according to the present embodiment and the measured values and their tendencies measured by the surface shape measurement system TMS-100 are mostly the same. Further, an error between the two measurement methods above is in the level of $1/1000$ mm.

As a result, it is apparent that the electronic component evaluation method and the electronic component evaluation device according to the present embodiment of the present invention have at least the same measurement accuracy as the existing measurement instrument (such as TMS-100). Further, because the TMS-100 performs the measurement by setting a measuring object on a dedicated loading stand, the measuring object is required to be pulled out from the process line so as to be set in the measurement instrument. Therefore, the measurement operations by the measurement instrument explained above is not suitable for a total measurement operation of the entire manufactured electronic components from the point of view of the time and the equipment.

On the other hand, in the present embodiment, because the measurement operations of the heights of the measurement points based on the imaging data that is obtained by imaging the electronic components by the camera are performed, the heights of the electronic components can be measured without touching the electronic components. Further, the present embodiment can be realized by providing the camera on the conveyance path of the electronic components. As a result, with respect to the electronic component evaluation method and the electronic component evaluation device according to the present embodiment of the present invention, because the equipment for the measurement operations is small and the measurement operations can be performed in a shorter period of time, all of the electronic components can be inspected (a total inspection can be realized). In addition, with respect to the electronic component evaluation method and the electronic component evaluation device according to the present embodiment, the measurement operations can be performed without touching the electronic components, the inclinations of the upper surface or the lower surface of the electronic components during the measurement operations do not change. As a result, the height of the electronic component can be accurately measured.

Further, with respect to the electronic component evaluation method and the electronic component evaluation device according to the present embodiment, because the inclination at the time of the mounting of the electronic component can be detected, an electronic component that would have a connection failure after the mounting can be detected prior to the mounting. As a result, it is possible to prevent a circuit board in which the plurality of electronic components are mounted on the mounting substrate from being a defective product.

Further, the embodiments of the present invention further include the following technical ideas or technical concepts.

(1) An electronic component evaluation method of evaluating an electronic component for causing a processor to execute computer-readable instructions stored in a memory, the electronic component having: a lower surface facing a mounting substrate; an upper surface having a flat main surface; and a plurality of mounting terminals configured to be mounted on the mounting substrate, the method including executing on the processor the steps of: obtaining terminal position information of the plurality of mounting terminals; generating a reference plane in which at least three mounting terminals of the plurality of mounting terminals reside in response to the terminal position information; and detecting height information of a height of at least one of the upper surface or the lower surface relative to the reference plane.

(2) The electronic component evaluation method according to (1), wherein in the detecting of the height information, the processor is configured to: cause a camera to capture an image of the electronic component from the lower surface; obtain image data from the captured image; obtain lower surface position information with respect to a plurality of positions of the lower surface in response to the image data; convert the lower surface position information into converted lower surface position information with respect to the reference plane; and detect the height information of the lower surface relative to the reference plane in response to the converted lower surface position information.

(3) The electronic component evaluation method according to (2), wherein in the generating of the reference plane, the processor is configured to obtain the terminal position information in response to the image data so as to generate the reference plane.

(4) The electronic component evaluation method according to any of (1)-(3), further including: evaluating a factor with respect to a configuration of the electronic component.

(5) The electronic component evaluation method according to (4), wherein in the evaluating, a degree of an inclination of either the upper surface or the lower surface is evaluated based on a difference between a maximum value and a minimum value of the height information with respect to the lower surface.

(6) The electronic component evaluation method according to (4), wherein in the evaluating, an inclination direction of an inclination of either the upper surface or the lower surface is evaluated based on the height information of two locations on the lower surface and a locational relationship between the two locations.

(7) An electronic component evaluation device for evaluating an electronic component, the electronic component having: a lower surface facing a mounting substrate; an upper surface having a flat main surface; and a plurality of mounting terminals configured to be mounted on the mounting substrate, the electronic component evaluation device including: a memory configured to store computer-readable instructions; and a processor configured to execute the computer-readable instructions so as to: obtain terminal position information of the plurality of mounting terminals; generate a reference plane in which at least three mounting terminals of the plurality of mounting terminals reside in response to the terminal position information; and detect height information of a height of at least one of the upper surface or the lower surface relative to the reference plane.

(8) A computer program product embodying computer-readable instructions stored on a non-transitory computer-readable medium for causing a computer to execute a process by a processor for evaluating an electronic component, the electronic component having: a lower surface facing a mounting substrate; an upper surface having a flat main surface; and a plurality of mounting terminals configured to be mounted on the mounting substrate, the computer program product including executing on the processor the steps of: obtaining terminal position information of the plurality of mounting terminals; generating a reference plane in which at least three mounting terminals of the plurality of mounting terminals reside in response to the terminal position information; and detecting height information of a height of at least one of the upper surface or the lower surface relative to the reference plane.

The electronic component evaluation method, the electronic component evaluation device, and the electronic component evaluation program being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims. Further, the above embodiments can be combined with each other and such combinations are not to be regarded as a departure from the spirit and scope of the invention.

What is claimed is:

1. An electronic component evaluation method for causing a processor to execute computer-readable instructions stored in a memory with respect to an electronic component, the electronic component having:
    an upper surface;
    a lower base part including a lower surface facing a mounting substrate, the lower surface being outwardly opposite to the upper surface, the lower surface having four outermost corners, the four outermost corners having first, second, third, and fourth measuring points, respectively; and
    a plurality of mounting terminals configured to be mounted on the mounting substrate, the plurality of mounting terminals being laterally shifted from the lower surface of the lower base part, the first, second, third, and fourth measuring points being located closer to a center point of the lower surface than the plurality of mounting terminals in a plan view, wherein the electronic component is placed on an evaluation plate in a state in which the upper surface is on the evaluation plate and the lower surface faces upward;
    the method comprising executing on the processor the steps of:
    obtaining terminal position information of the plurality of mounting terminals;
    generating a reference plane including at least three of the plurality of mounting terminals utilizing the terminal position information;
    capturing an image of the first, second, third, and fourth measuring points on the lower surface of the lower base part of the electronic component;
    obtaining image data from the captured image;
    obtaining lower base part position information of the first, second, third, and fourth measuring points on the lower surface of the lower base part in response to the image data;
    detecting height information of heights of at least two points of the first, second, third, and fourth measuring points with respect to the reference plane;
    obtaining a degree of inclination of the lower surface relative to the reference plane based on the height information; and
    evaluating the electronic component by comparing the obtained degree of inclination with a predetermined range.

2. The electronic component evaluation method according to claim 1,
    wherein the processor is further configured to cause a camera to capture the lower base part and the plurality of mounting terminals so as to obtain another image data, and
    the processor us configured to obtain the terminal position information in response to the another image data so as to generate the reference plane.

3. The electronic component evaluation method according to 2, further comprising:
    evaluating a factor with respect to a configuration of the electronic component based on the height information and the reference plane.

4. The electronic component evaluation method according to claim 3,
    wherein the processor is configured to obtain the degree of inclination of the lower surface based on a difference between a maximum value and a minimum value of the height inform ation relative to the reference plane.

5. The electronic component evaluation method according to claim 3,
    wherein the processor is configured to obtain an inclination direction of an inclination of the lower surface based on the height information with respect to two points of the first, second, third, and fourth measuring points and a locational relationship between the two points.

6. The electronic component evaluation method according to claim 1, further comprising:
    evaluating a factor with respect to a configuration of the electronic component based on the height information and the reference plane.

7. The electronic component evaluation method according to claim 6,
    wherein the processor is configured to obtain the degree of inclination of the lower surface based on a difference between a maximum value and a minimum value of the height information relative to the reference plane.

8. The electronic component evaluation method according to claim 6,
    wherein the processor is configured to obtain an inclination direction of an inclination of the lower surface based on the height information with respect to two points of the first, second, third, and fourth measuring points and a locational relationship between the tow points.

9. An electronic component evaluation device for evaluating an electronic component, the electronic component having:
    an upper surface;
    a lower base part including a lower surface facing a mounting substrate, the lower surface being outwardly opposite to the upper surface, the lower surface having four outermost corners, the four outermost corners having first, second, third, and fourth measuring pointsm respectively; and
    a plurality of mounting terminals configured to be mounted on the mounting substrate, the plurality of mounting terminals being laterally shifted from the lower surface of the lower base part, the first, second, third, and fourth measuring points being located closer to a center point of the lower surface than the plurality of mounting terminals in a plan view, wherein the electronic component is placed on an evaluation plate in a state in which the upper surface is on the evaluation plate and the lower surface faces upward,
    the electronic component evaluation device comprising:
    a memory configured to store computer-readable instructions; and
    a processor configured to execute the computer-readable instructions so as to:
    obtain terminal position information of the plurality of mounting terminals;
    generate a reference plane including at least three of the plurality of mounting terminals utilizing the terminal position information;
    capture an image of the first, second, third, and fourth measuring points on the lower surface of the lower base part of the electronic component;
    obtain image data from the captured image;

obtain lower base part position information of the first, second, third, and fourth measuring points in the lower surface of the lower base part in response to the image data;

detect height information of heights of at least two points of the first, second, third, and fourth measuring points with respect to the reference plane;

obtain a degree of inclination of the lower surface relative to the reference plane based on the height information; and evaluate the electronic component by comparing the obtained degree of inclination with a predetermined range.

10. The electronic component evaluation device according to claim 9,
wherein the processor is further configured to cause a camera to capture the lower base part and the plurality of mounting terminals so as to obtain another image data, and
the processor is configured to obtain the terminal position information in response to the another image data so as to generate the reference plane.

11. The electronic component evaluation device according to claim 9,
wherein the processor is configured to evaluate a factor with respect to a configuration of the electronic component based on the height information and the reference plane.

12. The electronic component evaluation device according to claim 11,
wherein the processor is configured to obtain the degree of inclination of the lower surface based on a difference between a maximum value and a minimum value of the height information relative to the reference plane.

13. The electronic component evaluation device according to claim 11,
wherein the processor is configured to obtain an inclination direction of an inclination of the lower surface based on the height information with respect to two points of the first, second, third, and fourth measuring points and a locational relationship between the two points.

14. A computer program product embodying computer-readable instructions stored on a non-transitory computer-readable medium for causing a computer to execute a process by a processor for evaluating an electronic component, the electronic component having:
an upper surface;
a lower base part including a lower surface facing a mounting substrate, the lower surface being outwardly opposite to the upper surface, the lower surface having four outermost corners, the four outermost corners having first, second, third, and fourth measuring points, respectively; and
a plurality of mounting terminals configured to be mounted on the mounting substrate, the plurality of mounting terminals being laterally shifted from the lower surface of the lower base part, the first, second, third, and fourth measuring points being located closer to a center point of the lower surface than the plurality of mounting terminals in a plan view, wherein the electronic component is placed on an evaluation plate in a state in which the upper surface is on the evaluation plate and the lower surface faces upward,
the computer program product comprising executing on the processor the steps of:
obtaining terminal position information of the plurality of mounting terminals;
generating a reference plane including at least three of the plurality of mounting terminals utilizing the terminal position information;
capturing an image of the first, second, third, and fourth measuring points on the lower surface of the lower base part of the electronic component;
obtaining image data from the captured image;
obtaining lower base part position information of the first, second, third, and fourth measuring points on the lower surface of the lower base part in response to the image data;
detecting height information of heights of at least two points of the first, second, third, and fourth measuring points with respect to the reference plane;
obtaining a degree of inclination of the lower surface relative to the reference plane based on the height information; and
evaluating the electronic component by comparing the obtained degree of inclination with a predetermined range.

15. The computer program product according to claim 14,
wherein the processor is further configured to cause a camera to capture the lower base part and the plurality of mounting terminals so as to obtain another image data, and
the processor is configured to obtain the terminal position information in response to the another image data so as to generate the reference plane.

16. The computer program product according to claim 14,
wherein the processor is configured to evaluate a factor with respect to a configuration of the electronic component based on the height information and the reference plane.

17. The computer program product according to claim 16,
wherein the processor is configured to obtain the degree of inclination of the lower surface based on a difference between a maximum value and a minimum value of the height information relative to the reference plane.

18. The computer program product according to claim 16,
wherein the processor is configured to obtain an inclination direction of an inclination of the lower surface based on the height information with respect to two points of the first, second, third, and fourth measuring points and a locational relationship between the two points.

* * * * *